US012792279B2

(12) United States Patent
Mikada et al.

(10) Patent No.: US 12,792,279 B2
(45) Date of Patent: Nov. 10, 2026

(54) INFORMATION PROCESSING SYSTEM, NON-TRANSITORY COMPUTER READABLE MEDIUM, AND INFORMATION PROCESSING METHOD THAT PREVENT OUTPUT APPARATUS FROM STARTING OPERATION IN ABNORMAL STATE

(71) Applicant: FUJIFILM Business Innovation Corp., Tokyo (JP)

(72) Inventors: Takuto Mikada, Kanagawa (JP); Kenta Koizumi, Kanagawa (JP); Satomi Kudo, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 18/454,800

(22) Filed: Aug. 24, 2023

(65) Prior Publication Data

US 2024/0319932 A1 Sep. 26, 2024

(30) Foreign Application Priority Data

Mar. 24, 2023 (JP) ................................ 2023-048552

(51) Int. Cl.

| | |
|---|---|
| ***G06F 3/12*** | (2006.01) |
| ***H04N 1/00*** | (2006.01) |
| ***H04N 1/32*** | (2006.01) |
| ***H04N 1/41*** | (2006.01) |
| *G06K 15/02* | (2006.01) |
| *H03M 7/30* | (2006.01) |
| *H03M 13/47* | (2006.01) |

(52) U.S. Cl.
CPC ............ *G06F 3/121* (2013.01); *G06F 3/1234* (2013.01); *H04N 1/00005* (2013.01); *H04N 1/00082* (2013.01); *H04N 1/00917* (2013.01); *H04N 1/32641* (2013.01); *H04N 1/32667* (2013.01); *H04N 1/41* (2013.01); *G06K 15/1865* (2013.01); *H03M 7/30* (2013.01); *H03M 13/47* (2013.01)

(58) Field of Classification Search
CPC ... G06F 3/121; G06F 3/1234; H04N 1/00005; H04N 1/00082; H04N 1/00917; H04N 1/32641; H04N 1/32667; H04N 1/41; G06K 15/1865; H03M 7/30; H03M 13/47
See application file for complete search history.

(56) References Cited

U.S. PATENT DOCUMENTS

| | | | | |
|---|---|---|---|---|
| 10,057,443 | B2 | 8/2018 | Hirao | |
| 11,501,163 | B2 * | 11/2022 | Ohashi | G06N 3/0455 |

FOREIGN PATENT DOCUMENTS

| | | |
|---|---|---|
| JP | H07210691 | 8/1995 |
| JP | 2005267425 | 9/2005 |
| JP | 2016123024 | 7/2016 |

* cited by examiner

*Primary Examiner* — Scott A Rogers
(74) *Attorney, Agent, or Firm* — JCIPRNET

(57) ABSTRACT

An information processing system includes a processor configured to: acquire data; compress the data; before completion of communication with an output apparatus, finish determination as to whether compressed data has an abnormality, the compressed data being obtained through compression of the data; and in response to presence of an abnormality in the compressed data, perform again the data acquisition and the data compression until the output apparatus starts operation.

7 Claims, 7 Drawing Sheets

INFORMATION PROCESSING SYSTEM, NON-TRANSITORY COMPUTER READABLE MEDIUM, AND INFORMATION PROCESSING METHOD THAT PREVENT OUTPUT APPARATUS FROM STARTING OPERATION IN ABNORMAL STATE

CROSS-REFERENCE TO RELATED APPLICATIONS

This application is based on and claims priority under 35 USC 119 from Japanese Patent Application No. 2023-048552 filed Mar. 24, 2023.

BACKGROUND

(i) Technical Field

The present disclosure relates to an information processing system, a non-transitory computer readable medium, and an information processing method.

(ii) Related Art

Japanese Unexamined Patent Application Publication No. 2005-267425 discloses an image processing apparatus. The image processing apparatus includes a decompression unit that receives image data obtained by compressing each page of a print job and that decompresses the compressed image data into image data having a predetermined format understandable to an image recording apparatus forming an image on a predetermined recording medium. The image processing apparatus also includes a detection unit and a controller. The detection unit detects a decompression error. When the position of occurrence of a decompression error is present outside an image recording area predetermined as an area in which an image is to be recorded on the predetermined recording medium, the controller exerts control to transmit an instruction to continue the decompression into image data having the predetermined format.

Japanese Unexamined Patent Application Publication No. 07-210691 discloses a compressed-image-data decoding apparatus including a data buffer and an image-decompression decoder. The data buffer temporarily holds compressed image data. The image-decompression decoder decodes the compressed image data into its original data. The compressed-image-data decoding apparatus includes a buffer management controller, an image data expansion unit, and an image data decompressing unit. The buffer management controller manages data in the data buffer. The image data expansion unit detects a decoding error occurring in decoding performed by the image-decompression decoder. The image data decompressing unit decodes compressed image data through software. The compressed-image-data decoding apparatus first causes the image-decompression decoder to decode compressed image data in the data buffer. In response to the image data expansion unit detecting a decoding error occurring in the decoding, the compressed-image-data decoding apparatus causes the image data decompressing unit to decode the compressed image data through software.

Japanese Unexamined Patent Application Publication No. 2016-123024 discloses an information processing apparatus which processes a job. The information processing apparatus includes a counter and a setting unit. The counter counts the number of retries of a job. When the condition for retrying a job is a first condition, the setting unit sets a first threshold to the counter. When the condition for retrying a job is a second condition, the setting unit sets a second threshold to the counter. The information processing apparatus includes a retry unit which, when an error in processing of a job is detected, repeatedly process the job on the basis of the first threshold or the second threshold which is set by the setting unit.

For example, assume an information processing system which generates compressed data obtained through compression of data such as an image and which outputs, to an output apparatus, decompressed data obtained through decompression of the compressed data. Such an information processing system has a problem in that, even when an abnormality occurs in the decompression of compressed data, the output apparatus has already started its operation such as printing.

SUMMARY

Aspects of non-limiting embodiments of the present disclosure relate to an information processing system, a non-transitory computer readable medium, and an information processing method which may prevent an output apparatus from starting its operation in an abnormal state, even when the output apparatus is to start its operation in a scheduled time.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an information processing system comprising a processor configured to: acquire data; compress the data; before completion of communication with an output apparatus, finish determination as to whether compressed data has an abnormality, the compressed data being obtained through compression of the data; and in response to presence of an abnormality in the compressed data, perform again the data acquisition and the data compression until the output apparatus starts operation.

BRIEF DESCRIPTION OF THE DRAWINGS

Exemplary embodiment of the present disclosure will be described in detail based on the following figures, wherein.

DETAILED DESCRIPTION

Figure 1:
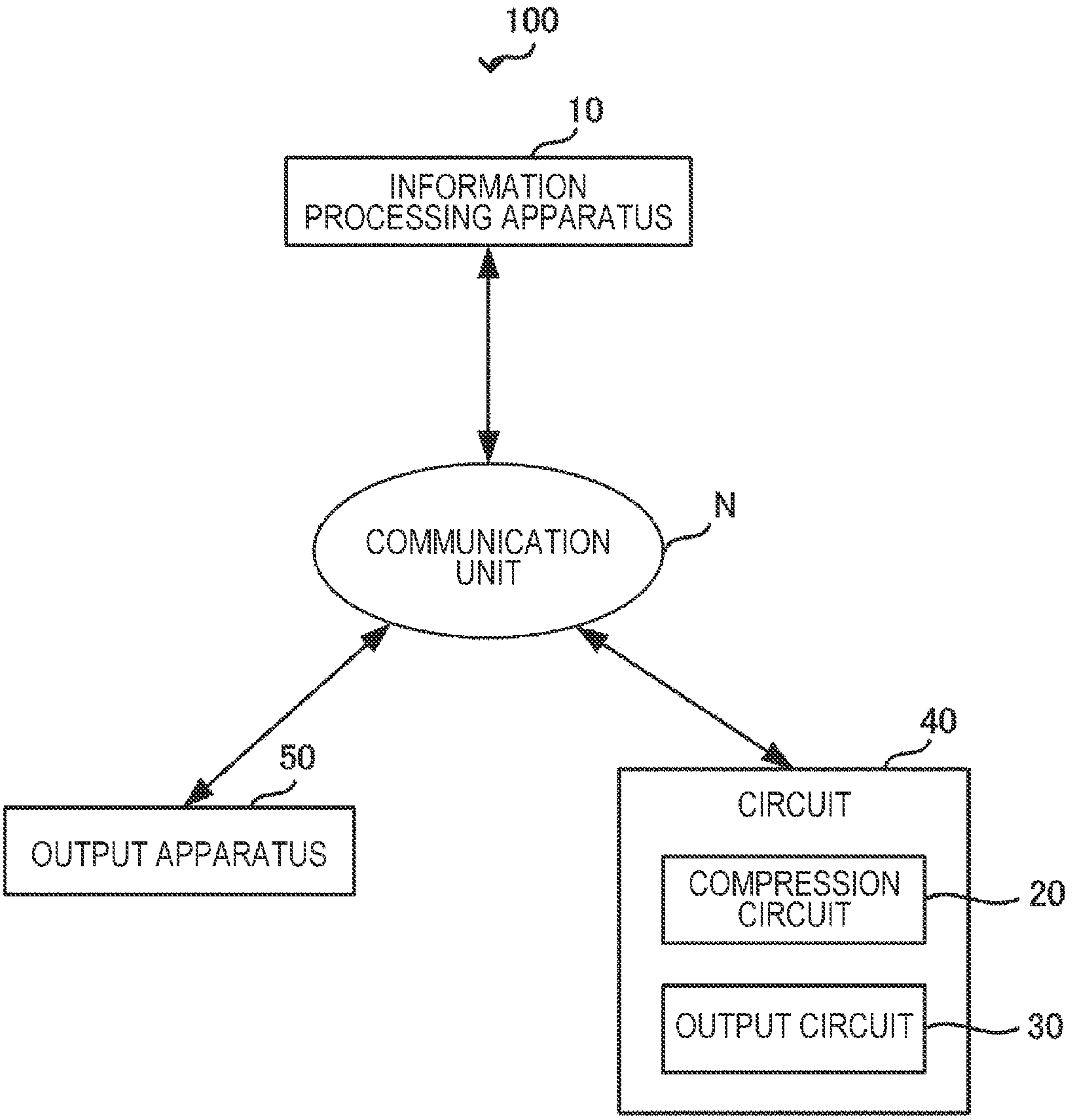
FIG. 1 is a schematic diagram illustrating an exemplary hardware configuration of a target system according to an exemplary embodiment.

An exemplary embodiment of the present disclosure will be described below by referring to the drawings. Identical or equivalent components or parts are designated with identical reference numerals in the drawings. The dimensional ratios in the drawings may be exaggerated for convenience of description, and may be different from actual ratios.

As illustrated in FIG. 1, a target system 100 according to the present exemplary embodiment includes an information processing apparatus 10, a circuit 40, and an output apparatus 50.

The information processing apparatus 10, the circuit 40, and the output apparatus 50 are capable of communicating with each other through a communication unit N. In the present exemplary embodiment, public communication lines, such as the Internet or telephone lines, are used as the communication unit N. However, the configuration is not limited to this. For example, in-house communication lines, such as a local area network (LAN) or a wide area network (WAN), may be used as the communication unit N, or a combination of in-house communication lines and public communication lines may be used. In the present exemplary embodiment, wireless communication lines are used as the communication unit N. However, the configuration is not limited to this. Alternatively, wired communication lines may be used as the communication unit N, or a combination of wired and wireless communication lines may be used.

The output apparatus 50 is an image forming apparatus in which two or more functions, for example, among image reading, image printing, image copying, and image transmission, are implemented in a single housing. However, the configuration is not limited to this example. For example, an apparatus, in which one of these functions is implemented, may be used as the output apparatus 50, or an apparatus, in which these functions are not implemented, may be used.

As illustrated in FIG. 1, the circuit 40 includes a compression circuit 20 and an output circuit 30. The circuit 40, the compression circuit 20, and the output circuit 30 are, for example, application specific integrated circuits (ASICs). The circuit 40 may be formed only of a single circuit.

Figure 2:
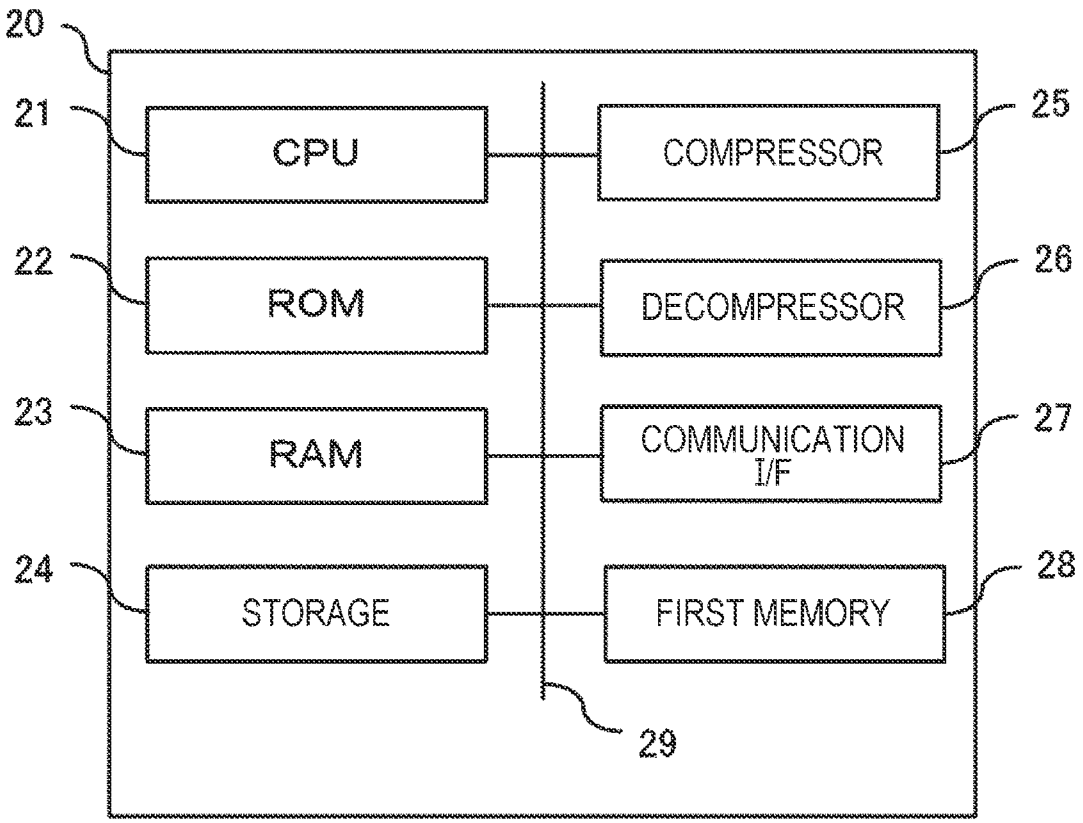
FIG. 2 is a block diagram illustrating an exemplary hardware configuration of a compression circuit according to an exemplary embodiment.

As illustrated in FIG. 2, the compression circuit 20 has the configurations of a central processing unit (CPU) 21, a read only memory (ROM) 22, a random access memory (RAM) 23, a storage 24, a compressor 25, a decompressor 26, a first memory 28, and a communication interface (I/F) 27. The configurations are communicatively connected to each other through a bus 29.

The CPU 21, which is a central processing unit, executes various programs and controls the units. That is, the CPU 21 reads programs from the ROM 22 or the storage 24, and executes the programs by using the RAM 23 as a work area. According to programs recorded in the ROM 22 or the storage 24, the CPU 21 controls the configurations and performs various computations. In the present exemplary embodiment, the ROM 22 or the storage 24 stores a compression-processing program.

The ROM 22 stores various programs and various data. The RAM 23 serves as a work area which temporarily stores programs and data. The storage 24, which is formed of a hard disk drive (HDD) or a solid state drive (SSD), stores various programs, including an operating system, and various data. In addition, the storage 24 stores a setting database.

The compressor 25 compresses data stored in the first memory 28. The data is, for example, image data.

The decompressor 26 decompresses compressed data obtained through compression by the compressor 25.

The communication I/F 27, which is an interface for communication with other apparatuses, uses standards, such as Ethernet™, fiber distributed data interface (FDDI), and Wi-Fi™.

The first memory 28 stores data that is to be compressed by the compressor 25 and compressed data that is data obtained through compression by the compressor 25. The first memory 28 is, for example, a rewritable memory, such as an electrically erasable programmable read-only memory (EEPROM), a static random access memory (SRAM), or a dynamic random access memory (DRAM).

The compression circuit 20 includes a direct memory access (DMA) controller (not illustrated). The DMA controller controls data transfer between the compressor 25, the decompressor 26, and the first memory 28.

Figure 3:
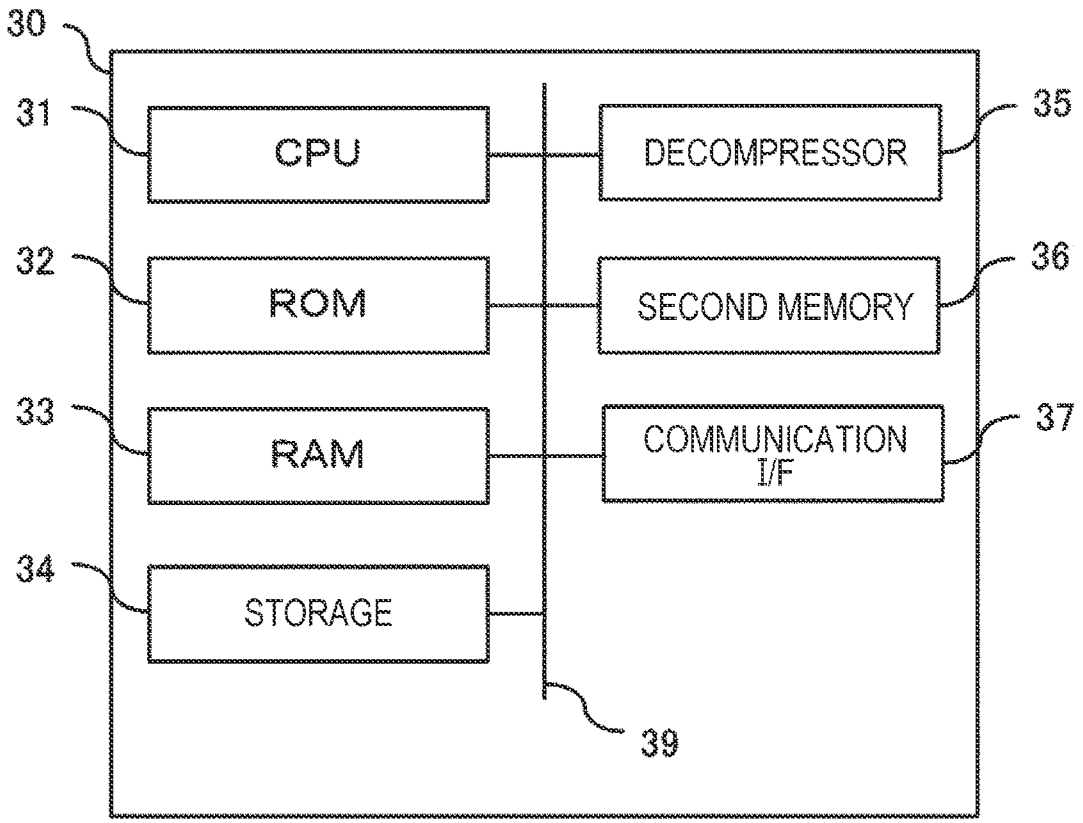
FIG. 3 is a block diagram illustrating an exemplary hardware configuration of an output circuit according to an exemplary embodiment.

As illustrated in FIG. 3, the output circuit 30 has the configurations of a CPU 31, a ROM 32, a RAM 33, a storage 34, a decompressor 35, a second memory 36, and a communication I/F 37. The configurations are communicatively connected to each other through a bus 39.

The CPU 31, which is a central processing unit, executes various programs and controls the units. That is, the CPU 31 reads programs from the ROM 32 or the storage 34 and executes the programs by using the RAM 33 as a work area. According to programs recorded in the ROM 32 or the storage 34, the CPU 31 controls the configurations and performs various computations. In the present exemplary embodiment, the ROM 32 or the storage 34 stores an output-processing program.

The ROM 32 stores various programs and various data. The RAM 33 serves as a work area which temporarily stores programs and data. The storage 34, which is formed of an HDD or an SSD, stores various programs, including an operating system, and various data.

The decompressor 35 decompresses compressed data obtained through compression by the compression circuit 20.

The second memory 36 stores compressed data that is to be decompressed by the decompressor 35 and decompressed data that is obtained through decompression by the decompressor 35 decompressing compressed data. The second memory 36 is, for example, a virtual memory.

The output circuit 30 includes a DMA controller (not illustrated). The DMA controller controls data transfer between the decompressor 35 and the second memory 36.

The communication I/F 37, which is an interface for communication with other apparatuses, uses standards, such as Ethernet™, FDDI, and Wi-Fi™.

The information processing apparatus 10 is an exemplary information processing system. "System" according to the present exemplary embodiment encompasses both a system including multiple apparatuses and a system including a single apparatus.

Figure 4:
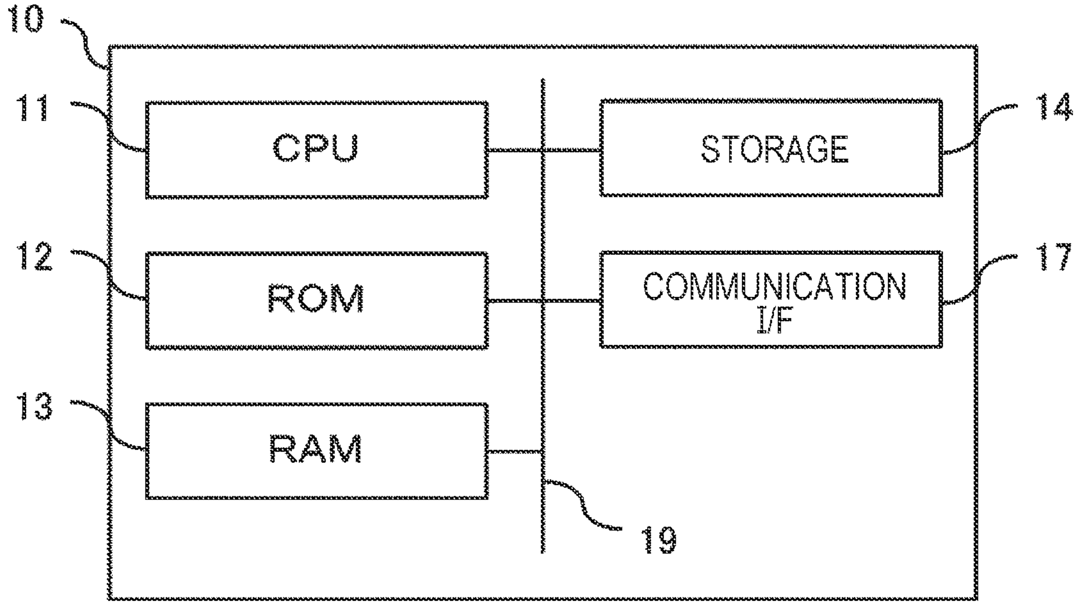
FIG. 4 is a block diagram illustrating an exemplary hardware configuration of an information processing apparatus according to an exemplary embodiment.

As illustrated in FIG. 4, the information processing apparatus 10 has the configurations of a CPU 11, a ROM 12, a RAM 13, a storage 14, and a communication I/F 17. The configurations are communicatively connected to each other through a bus 19.

The CPU 11, which is a central processing unit, executes various programs and controls the units. That is, the CPU 11 reads programs from the ROM 12 or the storage 14 and executes the programs by using the RAM 13 as a work area. According to programs recorded in the ROM 12 or the storage 14, the CPU 11 controls the configurations and performs various computations. In the present exemplary embodiment, the ROM 12 or the storage 14 stores an information processing program.

The ROM 12 stores various programs and various data. The RAM 13 serves as a work area which temporarily stores programs and data. The storage 14, which is formed of an HDD or an SSD, stores various programs, including an operating system, and various data. The storage 14 stores a setting database.

Instead of the compression circuit 20, the information processing apparatus 10 may include the first memory 28. Instead of the output circuit 30, the information processing apparatus 10 may include the second memory 36.

The communication I/F 17, which is an interface for communication with other apparatuses, uses standards, such as Ethernet™, FDDI, and Wi-Fi™.

Figure 5:
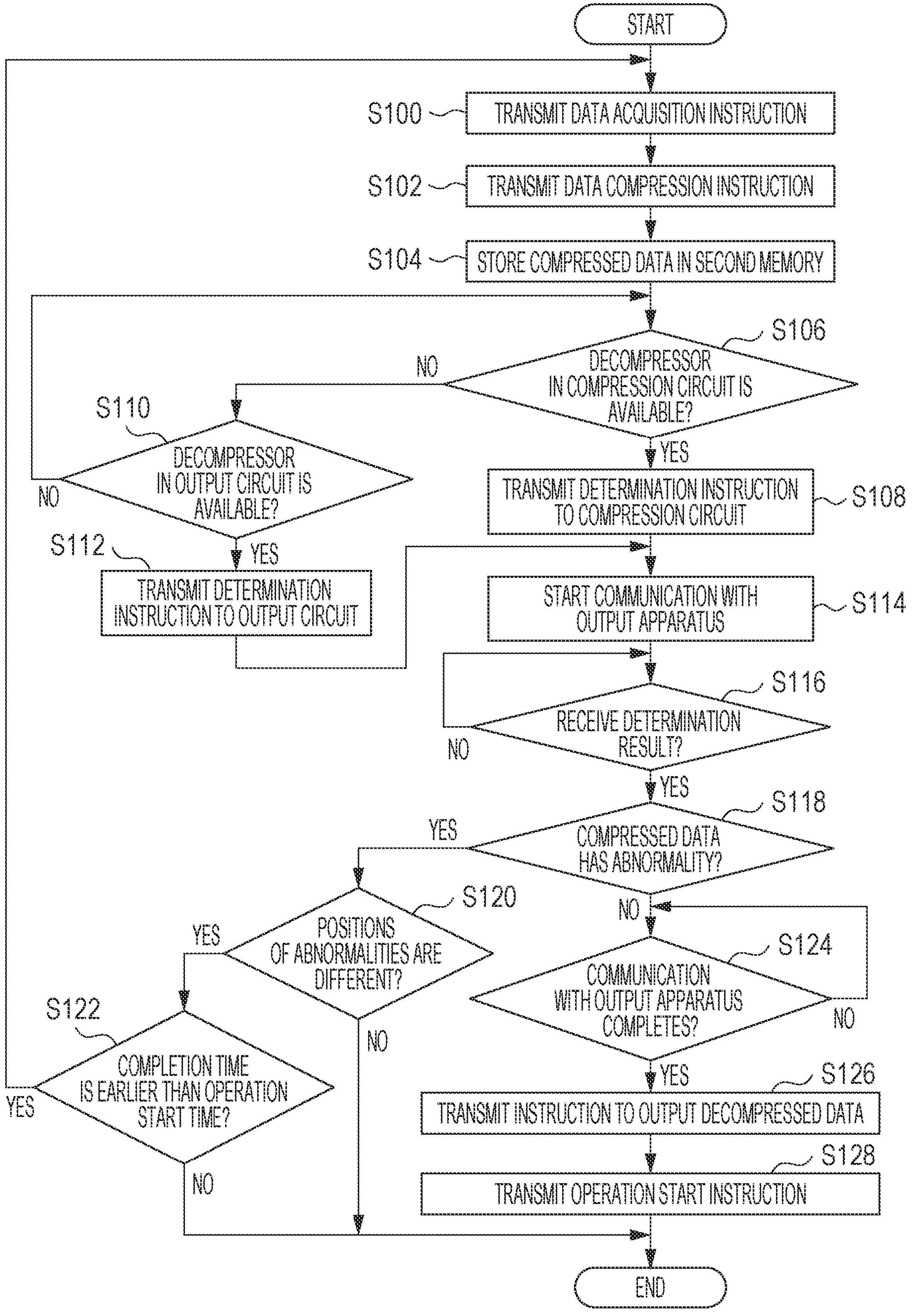
FIG. 5 is a flowchart of exemplary information processing performed by an information processing apparatus according to an exemplary embodiment.

Referring to FIG. 5, the flow of information processing performed by the information processing apparatus 10 according to the present exemplary embodiment will be described. The information processing is performed by the CPU 11 which reads the information processing program from the ROM 12 or the storage 14 and which loads the information processing program on the RAM 13 for execution.

In step S100 in FIG. 5, the CPU 11 transmits a data acquisition instruction to acquire data stored in the first memory 28. In the present exemplary embodiment, the CPU 11 transmits the data acquisition instruction to the compression circuit 20. Hereinafter, data related to a data acquisition instruction transmitted by the CPU 11 in step S100 is simply referred to as "data".

In step S102, the CPU 11 transmits a data compression instruction to compress the data. In the present exemplary embodiment, the CPU 11 transmits the data compression instruction to the compression circuit 20. The CPU 11 may transmit, to the compression circuit 20, the data acquisition instruction and the data compression instruction at the same time.

In step S104, the CPU 11 reads, from the first memory 28 of the compression circuit 20, the compressed data obtained through compression by the compression circuit 20, and stores the read data in the second memory 36 of the output circuit 30.

In step S106, the CPU 11 determines whether the decompressor 26 is available. Specifically, the CPU 11 receives, from the compression circuit 20, the use state of the decompressor 26, and determines whether the decompressor 26 is available on the basis of the use state. If the decompressor 26 is available, in other words, if the decompressor 26 is not being used (YES in step S106), the CPU 11 proceeds to step S108. In contrast, if the decompressor 26 is not available, in other words, if the decompressor 26 has already been used (NO in step S106), the CPU 11 proceeds to step S110.

In step S108, the CPU 11 transmits a determination instruction to the compression circuit 20. Specifically, the CPU 11 causes the decompressor 26 to determine whether the compressed data has an abnormality. Then, the CPU 11 proceeds to step S114. Examples of the abnormality include the state in which compressed data is damaged due to influence of noise.

In step S110, the CPU 11 determines whether the decompressor 35 is available. Specifically, the CPU 11 receives the use state of the decompressor 35 from the output circuit 30 and determines whether the decompressor 35 is available on the basis of the use state. If the decompressor 35 is available, in other words, if the decompressor 35 is not being used (YES in step S110), the CPU 11 proceeds to step S112.

In step S112, the CPU 11 transmits a determination instruction to the output circuit 30. Specifically, the CPU 11 causes the decompressor 35 to determine whether the compressed data has an abnormality. Then, the CPU 11 proceeds to step S114.

Back to step S110, if the decompressor 35 is not available, in other words, if the decompressor 35 has already been used (NO in step S110), the CPU 11 proceeds to step S106. That is, if the decompressor 26 and the decompressor 35 are not available, the CPU 11 waits until either one of the decompressors is available, and causes the decompressor, which is now available, to determine whether the compressed data has an abnormality.

In step S114, the CPU 11 starts communication with the output apparatus 50.

Specifically, the CPU 11 starts communication so that the output circuit 30 is allowed to output decompressed data to the output apparatus 50. For example, the CPU 11 starts communication so that, for example, the input/output trays of the output apparatus 50 and a setting for the sheet size or the sheet type for printing the decompressed data are determined. The communication with the output apparatus 50 requires, for example, about 500 ms for completion.

In the present exemplary embodiment, before the CPU 11 starts communication with the output apparatus 50, the CPU 11 causes the decompressor 26 or the decompressor 35 to determine whether compressed data has an abnormality. Thus, whether the compressed data has an abnormality is determined before completion of the communication with the output apparatus 50. However, the configuration is not limited to this example. After start of communication with the output apparatus 50, the CPU 11 may cause a decompressor to determine whether the compressed data has an abnormality. In this case, the CPU 11 determines whether the communication with the output apparatus 50 has completed before the CPU 11 causes the decompressor 26 or the decompressor 35 to determine whether the compressed data has an abnormality, that is, before execution of step S106. Specifically, if the communication with the output apparatus 50 has not completed, the CPU 11 performs step S106. If the communication with the output apparatus 50 has completed, the CPU 11 does not perform step S106, and ends the information processing.

In step S116, the CPU 11 waits until a result of determination as to whether the compressed data has an abnormality is received. If a result of determination as to whether the compressed data has an abnormality is received (YES in step S116), the CPU 11 proceeds to step S118.

In step S118, the CPU 11 determines whether a determination result indicating that the compressed data has an abnormality is received in step S116. If the compressed data has an abnormality (YES in step S118), the CPU 11 proceeds to step S120.

In step S120, the CPU 11 determines whether the position of the abnormality which has occurred in the compressed data is different from the position of an abnormality which occurred in the compressed data before. For example, if it has been determined twice that an abnormality occurs (that is, it is the second time that a positive determination is received in step S118), the CPU 11 determines whether the position of the this-time abnormality in the compressed data is different from the position of the first-time abnormality.

If the position of the abnormality which has occurred in the compressed data is the same as the position of an abnormality which occurred in the compressed data before (NO in step S120), the CPU 11 ends the information processing. When these positions are the same, it may be considered that an abnormality occurs in the compressed data due to some reason other than noise. Thus, it is highly likely that an abnormality occurs again at the same position even when acquisition and compression of data are repeatedly performed. The decompressor 26 and the decompressor 35 are capable of obtaining the position of an abnormality which occurs in compressed data. Therefore, for example, the CPU 11 receives, from the compression circuit 20 or the output circuit 30, the position of the abnormality, which has occurred in compressed data, as well as a determination result.

In contrast, if the position of the abnormality which has occurred in the compressed data is different from the position of an abnormality which occurred in the compressed data before (YES in step S120), the CPU 11 proceeds to step S122.

In step S122, the CPU 11 determines whether the completion time, at which re-execution of acquisition and compression of data completes, is earlier than the time at which the output apparatus 50 is to start its operation. Specifically, the CPU 11 estimates, as the completion time, the time at execution of step S122 plus the average time of execution from step S100 to step S104. The CPU 11 estimates the time, at which the output apparatus 50 is to start its operation, on the basis of the time at which communication with the output apparatus 50 started in step S114. For example, the CPU 11 adds the average time of execution from step S114 to step S128 to the time at which communication with the output apparatus 50 started. The CPU 11 compares the estimated completion time with the time at which the output apparatus 50 is to start its operation, and determines which time is earlier.

If the completion time is earlier than the time at which the output apparatus 50 is to start its operation (YES in step S122), the CPU 11 goes back to step S100. In contrast, if the completion time is not earlier than the time at which the output apparatus 50 is to start its operation (NO in step S122), the CPU 11 ends the information processing. That is, if the position of the abnormality which has occurred in the compressed data is different from the position of an abnormality which occurred in the compressed data before, and if the completion time is earlier than the time at which the output apparatus 50 is to start its operation, the CPU 11 repeatedly performs acquisition and compression of data. However, the configuration is not limited to this example. For example, when the position of the abnormality which has occurred in the compressed data is different from the position of an abnormality which occurred in the compressed data before, regardless of whether the completion time is earlier than the time at which the output apparatus 50 is to start its operation, the CPU 11 may repeatedly perform acquisition and compression of data. If the completion time is earlier than the time at which the output apparatus 50 is to start its operation, regardless of whether the positions of the abnormalities are the same, the CPU 11 may repeatedly perform acquisition and compression of data.

Back to step S118, if the compressed data does not have an abnormality (NO in step S120), the CPU 11 proceeds to step S124.

In step S124, the CPU 11 waits until completion of the communication with the output apparatus 50. If the communication with the output apparatus 50 completes (YES in step S124), the CPU 11 proceeds to step S126.

In step S126, the CPU 11 transmits, to the output circuit 30, an instruction to output, to the output apparatus 50, decompressed data obtained through decompression of the compressed data.

In step S128, the CPU 11 transmits, to the output apparatus 50, an operation start instruction to start its operation. Then, the CPU 11 ends the information processing. The output apparatus 50, which has received the operation start instruction, starts, for example, transport of a sheet and driving a motor, and thus starts an operation such as printing.

Figure 6:
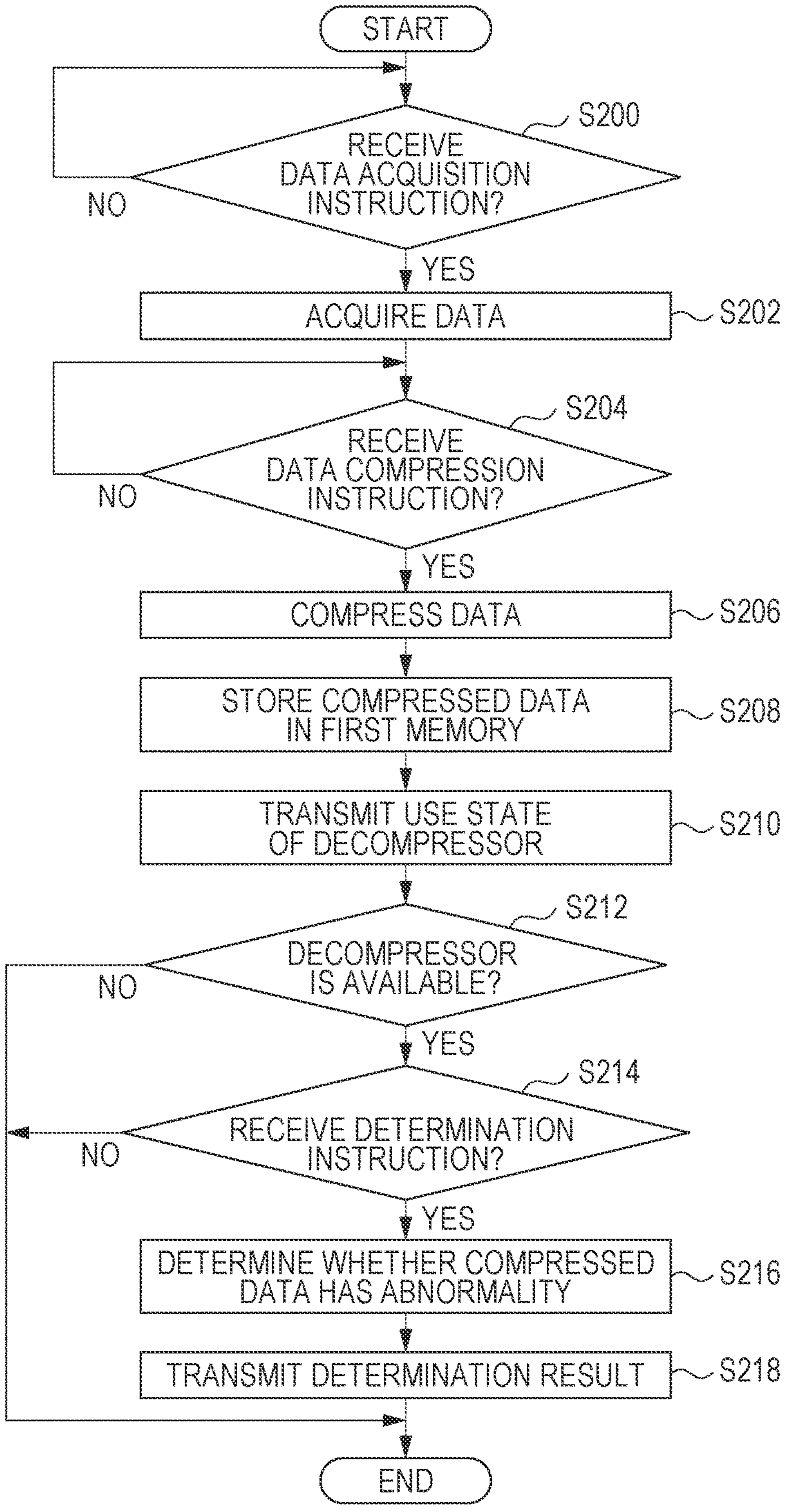
FIG. 6 is a flowchart of exemplary compression processing performed by a compression circuit according to an exemplary embodiment.

Referring to FIG. 6, the flow of compression processing performed by the compression circuit 20 according to the present exemplary embodiment will be described. The compression processing is performed by the CPU 21 reading the compression-processing program from the ROM 22 or the storage 24 and loading, for execution, the program on the RAM 23.

In step S200 in FIG. 6, the CPU 21 waits until a data acquisition instruction is received from the information processing apparatus 10. If a data acquisition instruction is received from the information processing apparatus 10 (YES in step S200), the CPU 21 proceeds to step S202.

In step S202, the CPU 21 acquires data from the first memory 28.

In step S204, the CPU 21 waits until a data compression instruction is received from the information processing apparatus 10. If a data compression instruction is received from the information processing apparatus 10 (YES in step S204), the CPU 21 proceeds to step S206.

In step S206, the CPU 21 compresses the data, which is obtained in step S202, by using the compressor 25.

In step S208, the CPU 21 stores, in the first memory 28, compressed data obtained through compression in step S206.

In step S210, the CPU 21 transmits, to the information processing apparatus 10, the use state of the decompressor 26. Specifically, the CPU 21 transmits, to the information processing apparatus 10, information as to whether the decompressor 26 is being used.

In step S212, the CPU 21 determines whether the decompressor 26 is available. If the decompressor 26 is available, in other words, if the decompressor 26 is not being used (YES in step S212), the CPU 21 proceeds to step S214. In contrast, if the decompressor 26 is not available, in other words, if the decompressor 26 has already been used (NO in step S212), the CPU 21 ends the compression processing.

In step S214, the CPU 21 determines whether a determination instruction is received from the information processing apparatus 10. If a determination instruction is received from the information processing apparatus 10 (YES in step S214), the CPU 21 proceeds to step S216. In contrast, if a determination instruction is not received from the information processing apparatus 10 (NO in step S214), the CPU 21 ends the compression processing.

In step S216, the CPU 21 reads the compressed data from the first memory 28, and determines, by using the decompressor 26, whether the compressed data has an abnormality.

In step S218, the CPU 21 transmits, to the information processing apparatus 10, the result of determination as to whether the compressed data has an abnormality. Then, the CPU 21 ends the compression processing.

Figure 7:
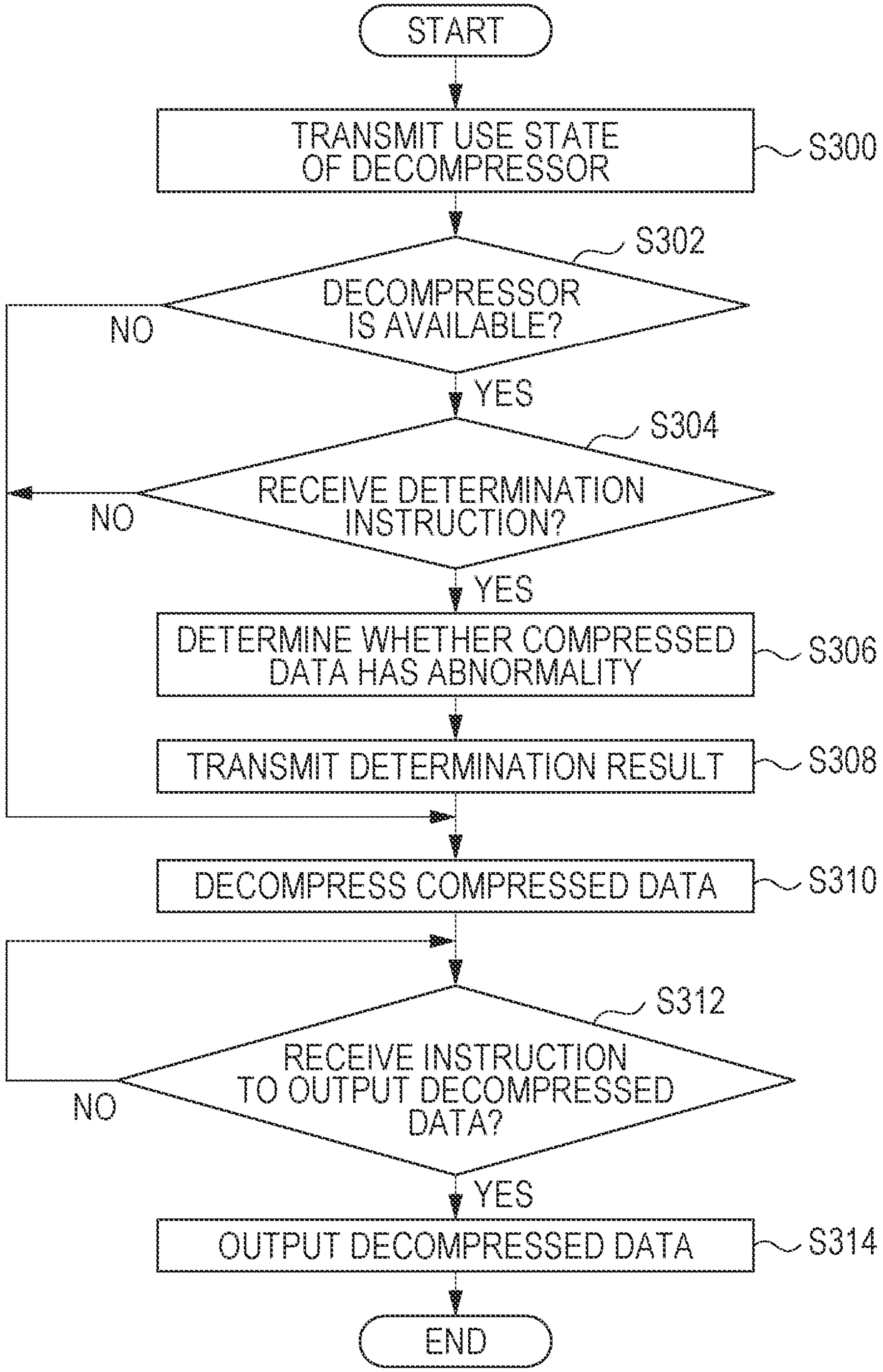
FIG. 7 is a flowchart of exemplary output processing performed by an output circuit according to an exemplary embodiment.

Referring to FIG. 7, the flow of output processing performed by the output circuit 30 according to the present exemplary embodiment will be described. The output processing is performed by the CPU 31 reading the output-processing program from the ROM 32 or the storage 34 and loading, for execution, the program on the RAM 33.

In step S300 in FIG. 7, the CPU 31 transmits, to the information processing apparatus 10, the use state of the decompressor 35. Specifically, the CPU 31 transmits, to the information processing apparatus 10, information as to whether the decompressor 35 is being used.

In step S302, the CPU 31 determines whether the decompressor 35 is available. If the decompressor 35 is available, in other words, if the decompressor 35 is not being used (YES in step S302), the CPU 31 proceeds to step S304. In contrast, if the decompressor 35 is not available (NO in step S302), the CPU 31 proceeds to step S310.

In step S304, the CPU 31 determines whether a determination instruction is received from the information processing apparatus 10. If a determination instruction is received from the information processing apparatus 10 (YES in step S304), the CPU 31 proceeds to step S306. In contrast, if a determination instruction is not received from the information processing apparatus 10 (NO in step S304), the CPU 31 proceeds to step S310.

In step S306, the CPU 31 reads the compressed data from the second memory 36, and determines, by using the decompressor 35, whether the compressed data has an abnormality.

In step S308, the CPU 31 transmits, to the information processing apparatus 10, the result of determination as to whether the compressed data has an abnormality.

In step S310, the CPU 31 causes the decompressor 35 to decompress the compressed data which has been read from the second memory 36.

In step S312, the CPU 31 waits until an instruction to output the decompressed data to the output apparatus 50 is received from the information processing apparatus 10. If an instruction to output the decompressed data to the output apparatus 50 is received (YES in step S312), the CPU 31 proceeds to step S314.

In step S314, the CPU 31 outputs, to the output apparatus 50, the decompressed data obtained through decompression in step S310. Then, the CPU 31 ends the output processing.

The exemplary embodiment is described above. However, the technical scope of the present disclosure is not limited to the scope described in the exemplary embodiment. Various changes and improvements may be added to the exemplary embodiment without departing from the gist of the present disclosure. Embodiment obtained by adding the changes or improvements is also encompassed in the technical scope of the present disclosure.

The exemplary embodiment does not limit the claims. Not all the combinations of features described in the exemplary embodiment are necessary for the present disclosure which addresses disadvantages. Various stages of disclosure are included in the exemplary embodiment described above. Various disclosures are extracted through combinations of multiple disclosed components. Even when some components are removed from all the components described in the exemplary embodiment, the configuration in which some components are removed may be extracted as the present disclosure as long as the effects are obtained.

For example, in the exemplary embodiment, the information processing apparatus 10 which is a single apparatus performs the information processing. However, the configuration is not limited to this example. For example, multiple apparatuses may perform the information processing.

In the exemplary embodiment described above, as a predetermined condition for repeated execution of acquisition and compression of data, the condition that the position of an abnormality which has occurred in compressed data is different from the position of an abnormality which occurred in the compressed data before and the condition that the completion time is earlier than the time at which the output apparatus 50 is to start its operation are used. However, the configuration is not limited to this example. For example, regardless of whether the predetermined conditions are satisfied, the CPU 11 may repeatedly perform acquisition and compression of data.

In the exemplary embodiment described above, the CPU 11 changes the decompressor used for determination as to whether compressed data has an abnormality, in accordance with the use states of the decompressor 26 and the decompressor 35. However, the configuration is not limited to this example. For example, regardless of the use states of the decompressor 26 and the decompressor 35, the CPU 11 may determine, by using a predetermined decompressor, whether compressed data has an abnormality.

In the exemplary embodiment described above, when the decompressor 26 and the decompressor 35 are not available, the CPU 11 waits until either one of the decompressors is available, and causes the decompressor, which is now available, to determine whether compressed data has an abnormality. However, the configuration is not limited to this example. For example, when the decompressor 26 and the decompressor 35 are not available, the CPU 11 may wait until a predetermined decompressor is available, and may cause the predetermined decompressor to determine whether compressed data has an abnormality.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

In the exemplary embodiments, the form in which the programs are installed in a ROM or a storage is described. However, the configuration is not limited to this. The programs according to the exemplary embodiments may be provided in the form in which the programs are recorded in a computer-readable storage medium. For example, the programs according to the exemplary embodiments may be provided in the form in which the programs are recorded in an optical disk, such as a compact disc (CD)-ROM or a digital versatile disc (DVD)-ROM, or in the form in which the programs are recorded in a semiconductor memory, such as a Universal Serial Bus (USB) memory or a memory card. Alternatively, the programs according to the exemplary embodiments may be obtained from an external apparatus through a communication I/F.

In the exemplary embodiments, the case in which the processes performed by the information processing apparatus 10, the compression circuit 20, and the output circuit 30 are implemented with a software configuration through execution of programs using a computer is described. However, the present disclosure is not limited to this. For example, the processes performed by the information processing apparatus 10 and the compression circuit 20 may be implemented with a hardware configuration or a combination of a hardware configuration and a software configuration.

In addition, the configurations of the information processing apparatus 10, the compression circuit 20, the output circuit 30, and the output apparatus 50, which are described in the exemplary embodiments, are exemplary. Needless to say, unnecessary parts may be deleted or new parts may be added without departing from the gist of the present disclosure.

The flows of processes performed by the information processing apparatus 10, the compression circuit 20, and the output circuit 30, which are described in the exemplary embodiments, are also exemplary. Needless to say, unnecessary steps may be deleted, new steps may be added, and the processing order may be replaced without departing from the gist of the present disclosure.

APPENDIX (((1)))

An information processing system comprising:

a processor configured to:

acquire data;

compress the data;

before completion of communication with an output apparatus, finish determination as to whether compressed data has an abnormality, the compressed data being obtained through compression of the data; and in response to presence of an abnormality in the compressed data, perform again the data acquisition and the data compression until the output apparatus starts operation.

(((2)))

The information processing system according to (((1))), wherein the processor is configured to:

when a predetermined condition is satisfied, repeatedly perform the data acquisition and the data compression.

(((3)))

The information processing system according to (((2))), wherein the predetermined condition is a condition that a position of the abnormality which occurs in the compressed data is different from a position of an abnormality which occurred in the compressed data before.

(((4)))

The information processing system according to (((2))) or (((3))), wherein the predetermined condition is a condition that a time of completion of re-execution of the data acquisition and the data compression is earlier than a time of start of operation of the output apparatus.

(((5)))

The information processing system according to any one of (((1))) to (((4))), wherein the processor is configured to:

change a decompressor used for determination as to whether the compressed data has an abnormality, in accordance with a use state of a decompressor included in a circuit including a compressor which compresses the data.

(((6)))

The information processing system according to (((5))), wherein the processor is configured to:

when the decompressor included in the circuit including the compressor is available, cause the decompressor to determine whether the compressed data has an abnormality; and when the decompressor included in the circuit including the compressor is not available, cause a different decompressor to determine whether the compressed data has an abnormality, the different decompressor being included in a circuit which outputs, to the output apparatus, decompressed data obtained through decompression of the compressed data.

(((7)))

The information processing system according to (((6))), wherein the processor is configured to:

when the decompressor included in the circuit including the compressor and the different decompressor included in the circuit which outputs the decompressed data to the output apparatus are not available, wait until either one of the decompressors is available; and cause the available decompressor to determine whether the compressed data has an abnormality.

(((8)))

An information processing program causing a computer to execute a process comprising:

acquiring data;

compressing the data;

before completion of communication with an output apparatus, finishing determination as to whether compressed data has an abnormality, the compressed data being obtained through compression of the data; and in response to presence of an abnormality in the compressed data, performing again the data acquisition and the data compression until the output apparatus starts operation.

What is claimed is:

1. An information processing system comprising:

a processor configured to:

acquire data;

compress the data;

before completion of communication with an output apparatus, finish determination as to whether compressed data has an abnormality, the compressed data being obtained through compression of the data; and in response to presence of an abnormality in the compressed data and a predetermined condition being satisfied, perform again the data acquisition and the data compression until the output apparatus starts operation, wherein the predetermined condition comprises a condition that a time of completion of re-execution of the data acquisition and the data compression is earlier than a time of start of operation of the output apparatus.

2. The information processing system according to claim 1, wherein the predetermined condition further comprises a condition that a position of the abnormality which occurs in the compressed data is different from a position of an abnormality which occurred in the compressed data before.

3. The information processing system according to claim 1, wherein the processor is configured to:

change a decompressor used for determination as to whether the compressed data has an abnormality, in accordance with a use state of a decompressor included in a circuit including a compressor which compresses the data.

4. The information processing system according to claim 3, wherein the processor is configured to:

when the decompressor included in the circuit including the compressor is available, cause the decompressor to determine whether the compressed data has an abnormality; and when the decompressor included in the circuit including the compressor is not available, cause a different decompressor to determine whether the compressed data has an abnormality, the different decompressor being included in a circuit which outputs, to the output apparatus, decompressed data obtained through decompression of the compressed data.

5. The information processing system according to claim 4, wherein the processor is configured to:

when the decompressor included in the circuit including the compressor and the different decompressor included in the circuit which outputs the decompressed data to the output apparatus are not available, wait until either one of the decompressors is available; and cause the available decompressor to determine whether the compressed data has an abnormality.

6. A non-transitory computer readable medium storing a program causing a computer to execute a process for information processing, the process comprising:

acquiring data;

compressing the data;

before completion of communication with an output apparatus, finishing determination as to whether compressed data has an abnormality, the compressed data being obtained through compression of the data; and in response to presence of an abnormality in the compressed data and a predetermined condition being satisfied, performing again the data acquisition and the data compression until the output apparatus starts operation, wherein the predetermined condition comprises a condition that a time of completion of re-execution of the data acquisition and the data compression is earlier than a time of start of operation of the output apparatus.

7. An information processing method comprising:

acquiring data;

compressing the data;

before completion of communication with an output apparatus, finishing determination as to whether compressed data has an abnormality, the compressed data being obtained through compression of the data; and in response to presence of an abnormality in the compressed data and a predetermined condition being satisfied, performing again the data acquisition and the data compression until the output apparatus starts operation, wherein the predetermined condition comprises a condition that a time of completion of re-execution of the data acquisition and the data compression is earlier than a time of start of operation of the output apparatus.

* * * * *